United States Patent [19]

Gabriel

[11] Patent Number: 5,198,072
[45] Date of Patent: Mar. 30, 1993

[54] METHOD AND APPARATUS FOR DETECTING IMMINENT END-POINT WHEN ETCHING DIELECTRIC LAYERS IN A PLASMA ETCH SYSTEM

[75] Inventor: Calvin T. Gabriel, Cupertino, Calif.
[73] Assignee: VLSI Technology, Inc., San Jose, Calif.
[21] Appl. No.: 549,511
[22] Filed: Jul. 6, 1990
[51] Int. Cl.$^5$ .......................................... H01L 21/306
[52] U.S. Cl. .................................... 156/627; 156/643; 156/345
[58] Field of Search ............... 156/643, 626, 627, 345; 204/192.13, 192.33, 298.03, 298.32; 437/7, 8; 427/10; 118/620, 665, 712

[56] References Cited

U.S. PATENT DOCUMENTS

| | | | |
|---|---|---|---|
| 4,341,593 | 7/1982 | Kurisaki et al. | 204/298.32 X |
| 4,566,941 | 1/1986 | Yoshida et al. | 204/192.32 X |
| 4,602,981 | 7/1986 | Chen et al. | 156/627 |
| 4,622,094 | 11/1986 | Otsubo | 156/627 |
| 4,810,335 | 3/1989 | Hieber | 156/627 X |
| 4,846,920 | 7/1989 | Keller et al. | 156/627 X |
| 4,936,967 | 6/1990 | Ikuhara et al. | 156/626 X |
| 4,960,610 | 10/1990 | Krough | 156/626 X |
| 5,016,663 | 5/1991 | Mase et al. | 156/626 X |

FOREIGN PATENT DOCUMENTS

| | | |
|---|---|---|
| 58-79722 | 5/1983 | Japan . |
| 59-41475 | 3/1984 | Japan . |
| 128718 | 6/1988 | Japan ................................. 156/627 |

OTHER PUBLICATIONS

VLSI Electronics Microstructure Science, vol. 8, 1984, "Plasma Processing for VLSI", editors Norman G. Einsbrush and Dale M. Brown, Academic Press, Inc., New York, N.Y.
Journal of Vacuum Science Technology, Mar./Apr. 16, 1979, pp. 385–387, "End-point determination of aluminum reactive ion etching by discharge impedance monitoring", K. Ukai and K. Hanazawa.

*Primary Examiner*—Thi Dang
*Attorney, Agent, or Firm*—The Hickman Law Firm

[57] ABSTRACT

A method for detecting imminent end-point when plasma etching a dielectric layer of a substrate by monitoring the D.C. bias voltage of the cathode during the etching process. The D.C. bias voltage gives an indirect reading of the impedance of the substrate which changes appreciably just prior to etch-through of the dielectric layer. The plasma etching process is then terminated and a less damaging etch process is used to complete the etch-through of the dielectric layer. The apparatus of the present invention includes an A.C. blocking network coupled to the cathode, an A/D converter coupled to the blocking network and a digital signal analyzer coupled to the A/D converter. Plasma etching can be automatically terminated by the signal analyzer upon the detection of imminent end-point.

20 Claims, 4 Drawing Sheets

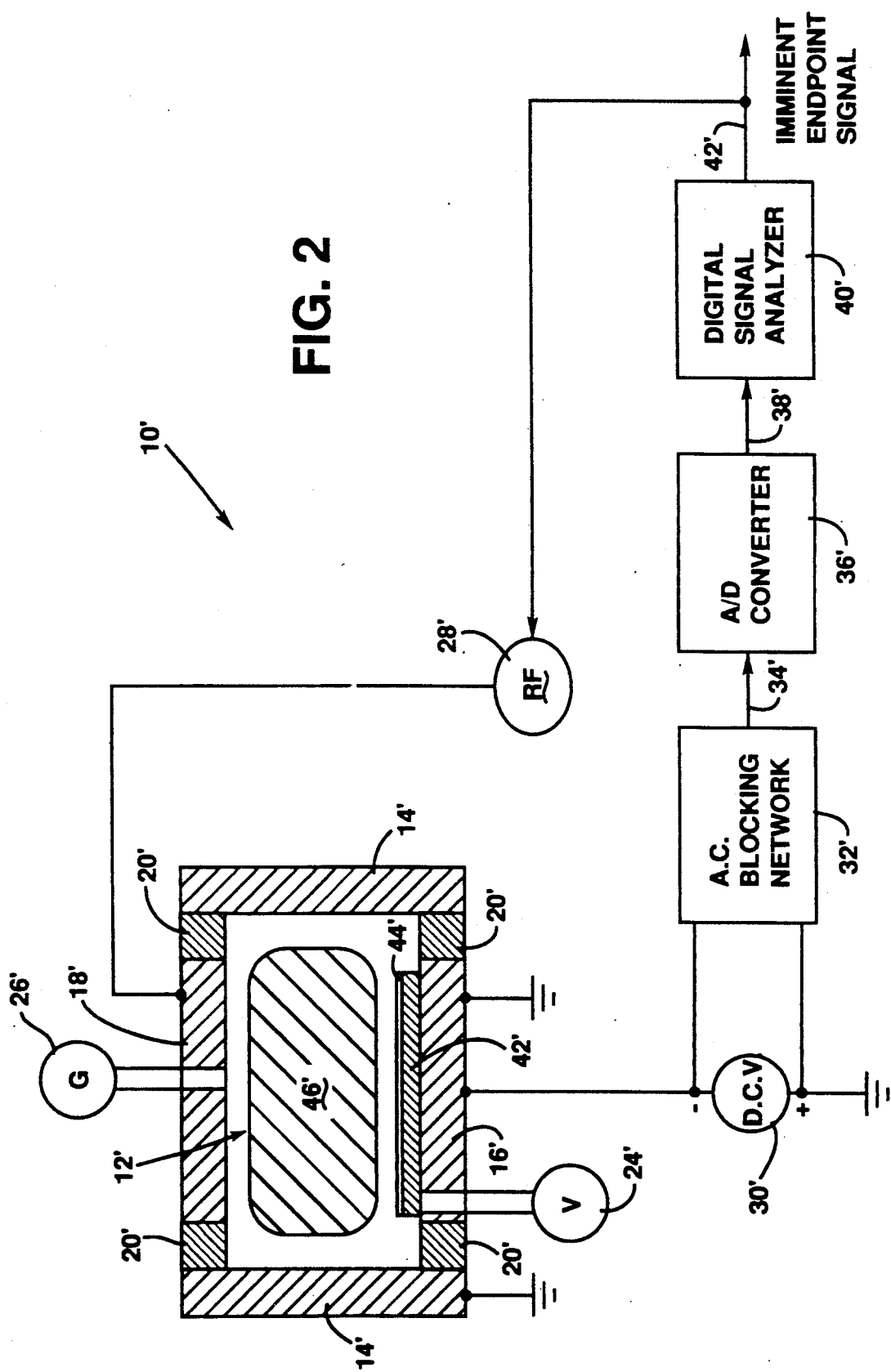

METHOD AND APPARATUS FOR DETECTING IMMINENT END-POINT WHEN ETCHING DIELECTRIC LAYERS IN A PLASMA ETCH SYSTEM

BACKGROUND OF THE INVENTION

This invention relates generally to plasma etch systems and more particularly to methods and apparatus for detecting end-point when etching semiconductor wafers in plasma etch systems.

The processing of semiconductor wafers to create integrated circuits involves a sequence of processing steps which build up the multi-layer structures of the integrated circuits. These processing steps include the deposition of metals, dielectrics and semiconductor films; the creation of masks by lithography techniques; the doping of semiconductor layers by diffusion and/or ion implantation; and the etching of layers for selective or blanket material removal.

There is a continuing trend in the semiconductor manufacturing industry to increase the functionality and performance of integrated circuits by increasing the number of circuit elements within each integrated circuit chip. While in some cases this is accomplished by increasing the size of the integrated circuit chip, in most cases this is accomplished by reducing the size and increasing the density of the circuit elements.

As the size of circuit elements decreases and their density increases, the processing steps enumerated above become more critical. For example, when making integrated circuits with feature dimensions on the order of 3 microns, a layer on a semiconductor wafer can be etched by the immersion of the wafer in a acid bath. This so-called "wet etch" method is generally inadequate for feature sizes less than 2 microns because it is an isotropic process which etches equally well in all directions. With smaller feature sizes, the isotropic etching causes undesirable undercutting of the masking layer and possible destruction of the closely spaced circuit elements.

To address the need for a more anisotropic etch process various "dry etch" processes have been developed which do not require the immersion of the wafer into an etching liquid. The most common dry etch process, generically referred to as "plasma etching", uses reactive plasmas are formed to anisotropically etch films on semiconductor wafers. Conventional plasma etching forms the plasma between a radio-frequency (R.F.) powered anode and a grounded cathode. Another form of plasma etching, known as reactive ion etching (RIE), applies R.F. power to the cathode and typically allows the anode to electrically float. In either case, positive ions formed in the plasma are accelerated towards the wafer by the self-biased negative cathode to provide an effective anisotropic etch of the wafer.

It is important to be able to predict or measure when the desired layer of an integrated circuit has been etched through, i.e., when the etch process has reached "end-point", in order to prevent damage to the wafer caused by excessive over-etching. End-point detection is particularly crucial in plasma etching, because this detection tends to have much lower selectivity than comparable wet etching processes. For example, it has been reported in *VLSI Electronics Microstructure Science*[1] that plasma etching of $SiO_2$ over doped silicon or polysilicon may produce a selectivity of only 15:1 while nearly infinite selectivity may be achieved by wet etching in HF acid solutions.

[1] *VLSI Electronics Microstructure Science*, Volume 8, 1984, "Plasma Processing for VLSI", editors Norman G. Einsbrush and Dale M. Brown, Academic Press, Inc., New York, N.Y.

The aforementioned *VLSI Electronic Microstructure Science* reference provides a good overview of end-point detection methods for plasma etch systems on pages 434–445. Briefly, end-point detection methods either monitor the emission spectra of the plasma, the surface layer of the wafer, or one of the operating parameters of the plasma etch system itself. Those end-point detection methods which monitor one of the operating parameters of the plasma etch system fall into two general categories, namely, those methods which monitor reaction chamber pressure and those methods which monitor the impedance of the high-frequency plasma.

Several examples of impedance matching monitoring systems are given in *VLSI Electronic Microstructure Science*, supra. For example, *VLSI Electronics Microstructure Science* reports that Ukai et al.[2] discovered that there is a significant impedance change in the plasma during the reactive ion etch (RIE) of aluminum with $CCl_4$. Similar observations were made for the etching of $Si_3N_4$ or polysilicon with a $CF_4O_2$ plasma. A comparison of the impedance changes in the plasma during etching with optical emission end-point detection methods indicates that the impedance matching method is an sensitive as optical emission monitoring in determining end-point.

[2] *Journal of Vacuum Science Technology*, 16, March/April 1979, pp 385-387, "End-point determination of aluminum reactive ion etching by discharge impedance monitoring", K. Ukai and K. Hanazawa Ukai et al., supra, monitored the impedance of the plasma by monitoring the cathode voltage during the RIE etch process. The change in monitored impedance in the Ukai et al, process was reported to be caused by the physical or chemical reactions in the plasma discharge. See Ukai et al., page 385, column 1. As a result, Ukai et al, can only detect end-point when the concentration of material from the layer being etched in the plasma discharge changes substantially, i.e. after at least partial etch-through of the layer.

A problem encountered with plasma etching is that some materials, such as the silicon substrate itself, can become damaged by the plasma even after a brief exposure. Therefore, methods such as those described in *VLSI Electronics Microstructure Science* and Ukai et al. to determine the termination of an etching process are inadequate for plasma-sensitive substrates such as silicon and polysilicon because by the time these methods detect end-point the substrate may have already been damaged. It would therefore be extremely desirable to have a method which detects imminent end-point, i.e. a method for determining when the layer being etched is just about to be etched-through.

SUMMARY OF THE INVENTION

The present invention detects imminent end-point when plasma etching dielectrics thereby permitting the process to be terminated before the substrate is damaged. This is accomplished by monitoring the impedance change of the wafer itself rather than the prior art method of monitoring the impedance change in the plasma.

Briefly, the method of the present invention involves placing a substrate having a dielectric layer to be etched within a plasma etch chamber and monitoring the D.C. bias on the cathode to indirectly measure the change in impedance of the substrate being etched. Imminent end-point is preferably determined by analyzing the D.C. bias as a function of time, i.e. endpoint is considered to be imminent when the D.C. bias curve flattens or reaches a point of inflection. The plasma etching process is then terminated and a less destructive etching process is used to remove the remaining dielectric thin film.

The apparatus of the present invention preferably includes an A.C. blocking network coupled to the cathode of the plasma etch system, an analog-to-digital (A/D) converter to digitize the D.C. component of the cathode voltage and a digital processor for comparing a time-series of cathode voltages against a predetermined criteria to determine when end-point is imminent. The apparatus can provide a signal to indicate to an operator that end-point is imminent or it can automatically shut down the plasma etching process upon the determination of imminent end-point.

These and other advantages of the present invention will become clear to those skilled in the art upon a study of the detailed description of the invention and of the several figures of the drawings.

BRIEF DESCRIPTION OF THE DRAWINGS

FIG. 2 is a schematic and pictorial diagram of an alternate embodiment of an apparatus for detecting end-point in accordance with the present invention.

DETAILED DESCRIPTION OF THE PREFERRED EMBODIMENTS

Figure 1:
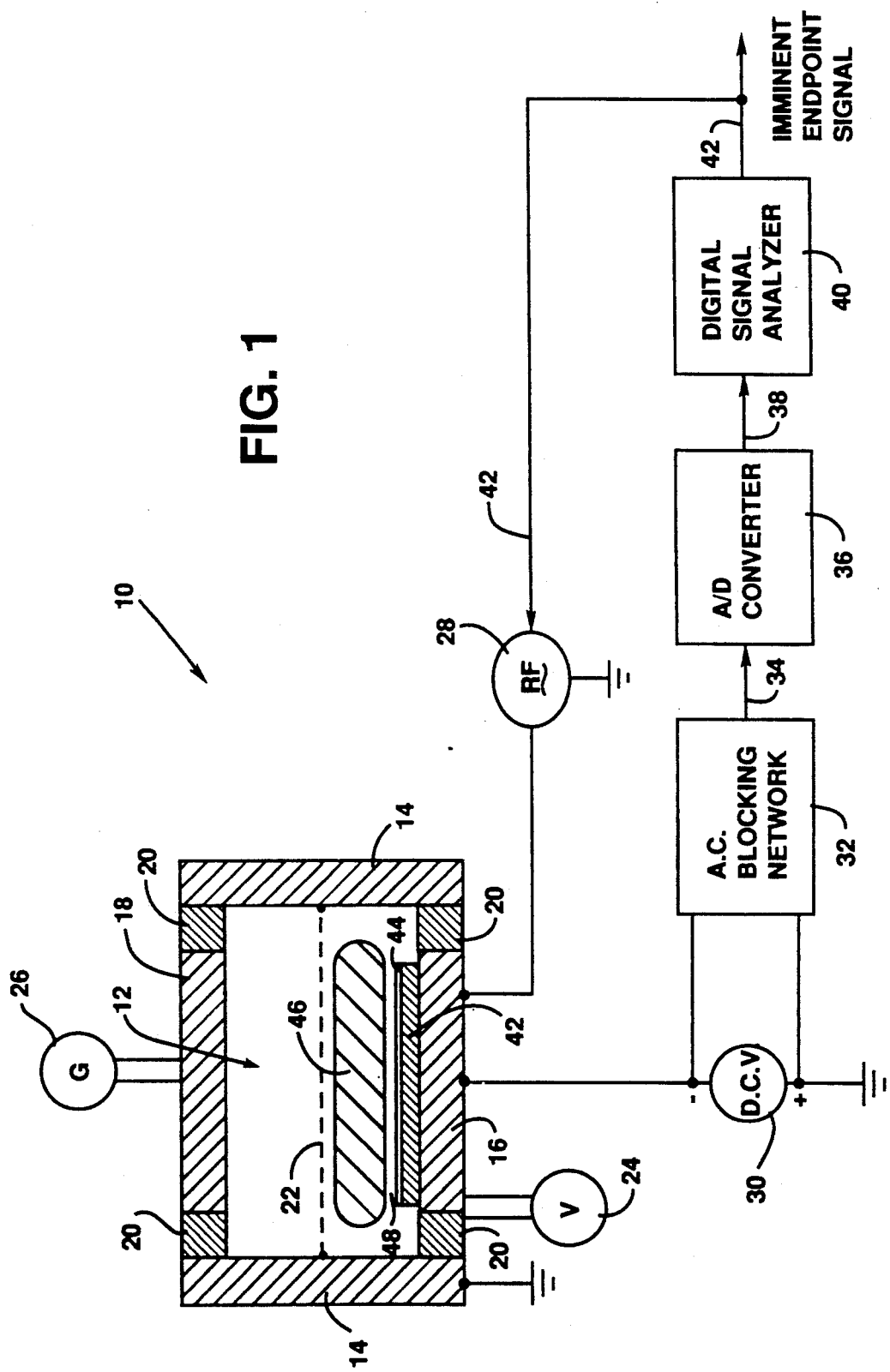
FIG. 1 is a schematic and pictorial diagram of a preferred apparatus for detecting imminent end-point in accordance with the present invention.

In FIG. 1, a dielectric etching apparatus 10 includes a chamber 12 enclosed by walls 14, a cathode 16 and an anode 18. The walls 14, cathode 16 and anode 18 are made from a conductive material, such as aluminum, and are electrically insulated from each other by insulators 20. A conductive grid 22 extends across the middle of the chamber 12 and is electrically coupled to walls 14. Chamber 12, being fully enclosed, can be evacuated by a vacuum pump 24 to the range of 50–300 millitorr. Reactant gasses can be introduced into the chamber from gas source 26.

Dielectric etching apparatus 10 is operated in the reactive ion etch mode where the anode 18 is grounded or is allowed to electrically float, the walls 14 and grid 22 are grounded and the cathode 16 is powered by a radio frequency generator 28 which typically oscillates at 13.56 Mhz. Similar RIE chambers to that described above are commercially available from companies such as Drytek, Inc. (Drytek 384-T RF Triode Etcher TM) and Applied Materials, Inc. (Precision 5000 Etch TM). It should be noted that the method and apparatus of the present invention will operate with virtually any RIE chamber design and does not require the grid 22 of this preferred embodiment for proper operation.

A D.C. voltmeter 30 is coupled to the cathode 16 to provide a read-out of the D.C. bias on the cathode. An A.C. blocking network 32 is also connected to the cathode 16 to provide a D.C. bias signal on a line 34. The A.C. blocking network typically includes a network of passive components such as inductors, resistors and capacitors which pass the D.C. bias signal but which greatly attenuate A.C. signals. An analog-to-digital converter 36 converts the analog D.C. bias signal on line 34 to a digital D.C. bias signal on a line 38. A digital or analog signal analyzer 40 inputs a series of D.C. bias input signals and compares them against a predetermined criteria to develop an imminent end-point signal on a signal line 41. The imminent end-point signal can be used to deactivate the R.F. generator 28 thereby automatically terminating the etch process prior to damaging the object being etched.

In operation, a substrate 42 having a dielectric layer 44 on its surface is placed within chamber 12 upon or closely proximate to cathode 16. The substrate 42 typically comprises a silicon wafer and may have one or more insulating and conducting layers between the wafer surface and the dielectric layer 44. The dielectric layer 44 is typically $SiO_2$ or $Si_3N_4$. The chamber is then partially evacuated by means of vacuum pump 24 and reactive gasses are introduced into chamber 12 from gas source 26. Radio frequency power is applied to cathode 16 by R.F. generator 28 to form a plasma 46 between the cathode 16 and the grid 22. The plasma 46 includes neutrals, free electrons and positively charged ions of the reactive gases and matter from the dielectric layer 44. The free electrons are repelled by the grounded walls 14 and grid 22 and therefore impinge upon cathode 16 to create a negative charge thereupon. This negative charge, which is often of the order of a negative 1000 volts, produces a negative D.C. self-bias on the cathode 16 without the need for an external D.C. power supply. The negative D.C. bias attracts the positively charged ions within the plasma 46 towards the cathode 16 causing some of the ions to impinge upon and thereby etch the dielectric layer 44. Since the positively charged ions tend to move vertically, the etching process is essentially anisotropic.

During the etching process, the D.C. bias signal on cathode 16 is continuously detected by blocking network 32, converted by A/D converter 36 and analyzed by digital signal analyzer 40. Since the D.C. bias on cathode 16 is a function of the impedance of the dielectric etching apparatus 10 as seen from the cathode, the present invention indirectly monitors the impedance changes within the apparatus 10 by monitoring the D.C. bias of cathode 16. As long as there is a continuous layer of dielectric material 44 on the substrate 42 and the pressure within the chamber 12 remains substantially constant, the impedance of the plasma 46 also remains substantially constant. In other words, the impedance of the plasma 46 will not change as long as no portion of the dielectric layer 44 has etched-through. Therefore, prior to etch-through, variations in D.C. bias are primarily the result of impedance changes of the dielectric layer. It is contemplated that this impedance change occurs due to the thinning of the dielectric layer resulting in enhanced capacitive and conductive coupling of the substrate to the plasma.

The method of this invention therefore involves placing a substrate having a dielectric layer to be etched within a plasma etch chamber adjacent to a cathode, activating the R.F. power to the cathode and releasing reactant gas into the chamber, detecting the D.C. bias on the cathode and determining imminent end-point by comparing the D.C. bias against a predetermined criteria. After imminent end-point is determined the R.F. power to the cathode is removed. The remaining thin film of dielectric material can be removed by a less destructive etching method, such as one of the wet etching methods well known to those skilled in the art.

Figure 1A:
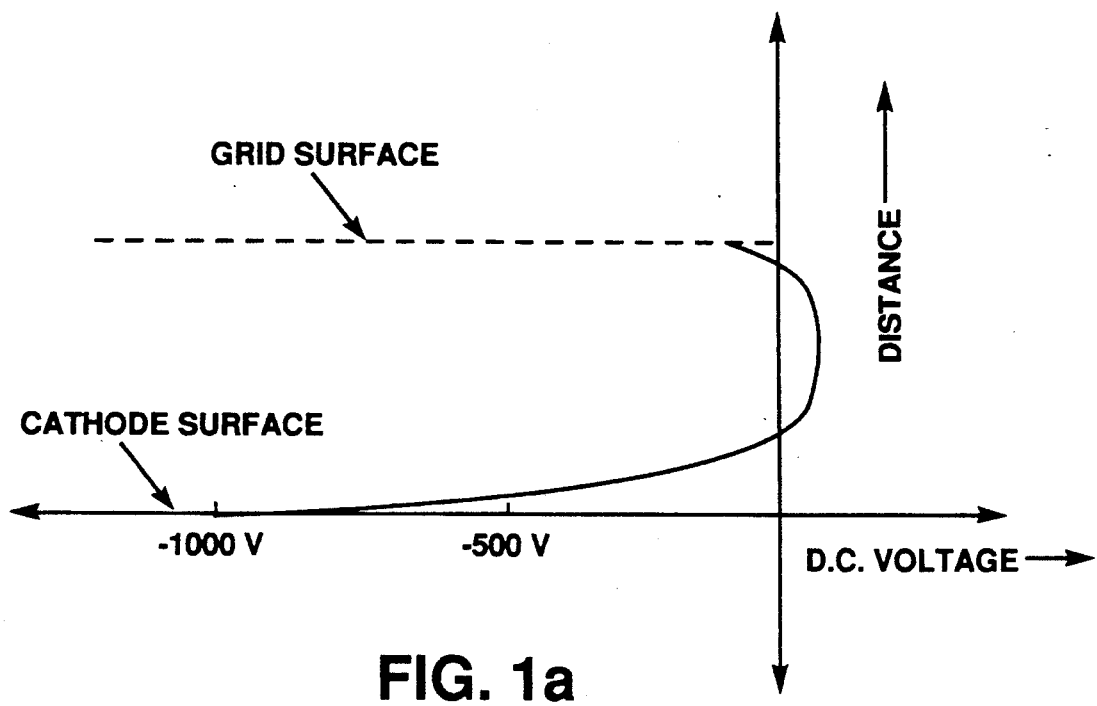
FIG. 1a is a graph illustrating the D.C. voltage levels in the plasma formed between the grid and the cathode of the apparatus of FIG. 1.

The theory of the present invention will be discussed with additional reference to FIG. 1a where the electrical potential of the plasma is plotted as a function of the distance from the cathode volts, while the cathode 16 is typically at approximately $-1000$ volts. The plasma 46 itself is typically slightly positive (e.g. approximately $+100$ volts) due to electron depletion. A small sheath or dark space 48 (FIG. 1) between the plasma 46 and the substrate becomes rapidly more negative with closer proximity to the cathode 16.

The electrical potential between the grid 22 and the cathode 16 in the RIE mode apparatus 10 is non-symmetrical due to the aforementioned self-biasing effect. The non-symmetrical nature of the electrical potential amplifies the effect of impedance changes in the system such that even a slight impedance change will make a detectable difference in the D.C. bias on the cathode 16. This phenomenon is used advantageously in the present invention to detect impedance changes in the dielectric layer, thereby signaling an imminent end-point condition.

Figure 1B:
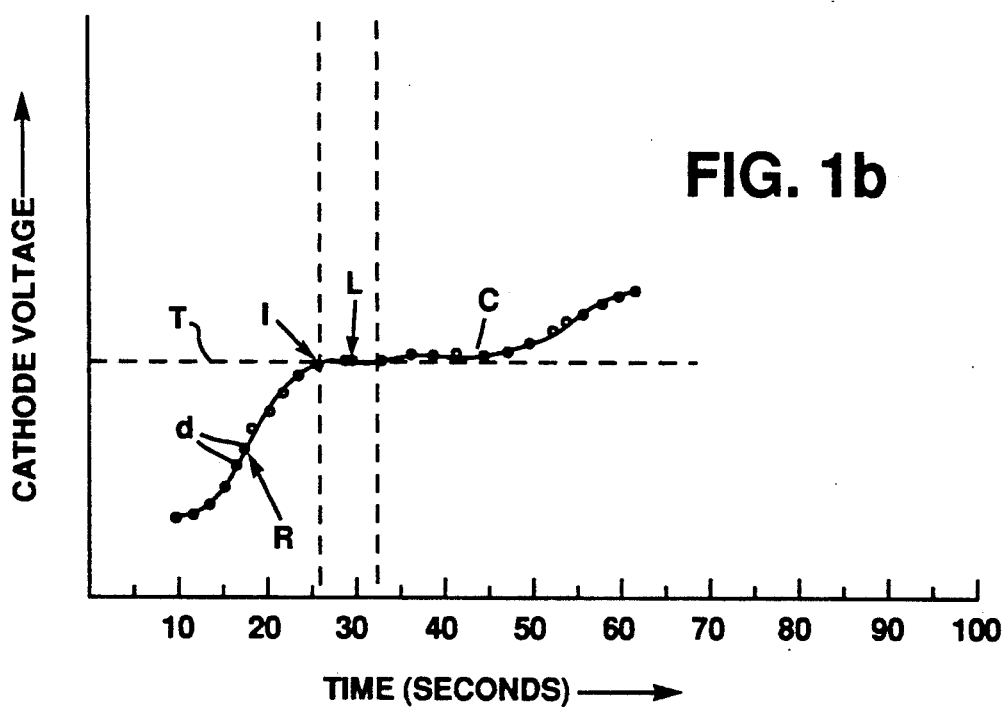
FIG. 1b is a graph illustrating the cathode bias as a function of time with the apparatus of FIG. 1.

In FIG. 1b, a graph plotting D.C. bias versus time illustrates the basis for determining the predetermined criteria for imminent end-point in accordance with the present invention. After the initiation of the plasma etching process the digital signal analyzer 40 (FIG. 1) monitors the D.C. bias of the cathode 16 at discrete time intervals to create a number of data points $d=f(t)$, representing the cathode D.C., bias voltage which are illustrated graphically as curve C in FIG. 1b.

The signal analyzer 40 (FIG. 1) compares the data points d against a predetermined criterion to determine when end-point is imminent. One such predetermined criterion is simple threshold detection where imminent end-point is determined or identified when a data point d equals or exceeds a predetermined threshold voltage T. This criterion is not very sophisticated because it does not take into account process and wafer variations. For example, the threshold voltage T might have to be redefined when wafers having different layers are introduced into the system, or if the gas mixture or pressure of the system are varied. Nevertheless, simple threshold detection may be a sufficient criteria for detecting imminent end-point if variables in the processing of the wafers are minimized.

A more sophisticated predetermined criterion looks not to the absolute value of the cathode voltage but rather to the trend of the data points d, i.e. the curvature of the curve C. It has been discovered that the curve C displays a consistent pattern when endpoint is imminent, namely a rapid rise in cathode voltage level followed by a levelling off or a point of inflection. The rise can be seen at section R of curve C, the point of inflection at point I and the levelling off at point L. Regardless of the scale or voltage offset of curve C, this pattern appears to be consistent. It is therefore a preferred method of this invention to analyze the D.C. bias on the cathode for characteristics of this curve C. For example, the level portion L can be determined when the first derivative of the curve C with respect to time is zero. As another example, a point of deflection I can be determined when the first and second derivatives of the curve C with respect to time are simultaneously zero.

It should be noted that the analysis of the cathode voltage and its comparison against a predetermined criterion can be accomplished by analog circuitry in the signal analyzer as well as the digital circuitry described above. For example, the analog circuitry to compare the D.C. bias of the cathode against a threshold voltage is straightforward. It is also straightforward to provide analog computation of first and second derivatives to detect the level portion L and the point of inflection I, respectively, of the curve C. Therefore the present invention contemplates both the digital and analog analysis of the D.C. bias on the cathode to detect imminent end-point of a dielectric etch apparatus.

In FIG. 2, a dielectric etching apparatus 10' includes a chamber 12' enclosed by walls 14', a cathode 16' and an anode 18'. As with the apparatus 10, walls 14', cathode 16' and anode 18' are made from an conductive material and are electrically insulated from each other by insulators 20'. The chamber 12' can be evacuated by a vacuum pump 24' and reactant gasses can be introduced into chamber 12' from gas source 26'. As opposed to the apparatus 10, dielectric apparatus 10' is operated in a plasma etch mode where anode 18' is coupled to an RF generator 28' while the cathode 16' is grounded.

The remainder of the dielectric etching apparatus 10' is very similar to the apparatus 10 described above. A D.C. voltmeter 30' is coupled to the cathode 16' to measure the D.C. bias of the cathode. An A.C. blocking network 32' is coupled across the voltmeter 30' to provide a D.C. bias signal on a line 34'. An analog-to-digital converter 36' converts the analog D.C. bias signal to a digital D.C. bias signal on a line 38'. Finally, a digital signal analyzer 40' inputs a series of D.C. bias signals and compares them against a predetermined criteria to develop an imminent end-point signal on a line 42' which can be used to automatically control R.F. generator 28'.

The operation of the apparatus 10' is similar to apparatus 10. A substrate 42' having a dielectric layer 44' is placed within chamber 12' upon or closely proximate to cathode 16'. The chamber 12' is evacuated by vacuum pump 24' and reactive gasses are introduced into chamber 12' from gas source 26'. Radio frequency power is applied to anode 18' to form a plasma 46' between the cathode 16' and the anode 18'. The positively charged ions in the plasma 46' are accelerated towards the negatively self-biased cathode 16' thereby etching the dielectric layer 44.

Figure 2A:
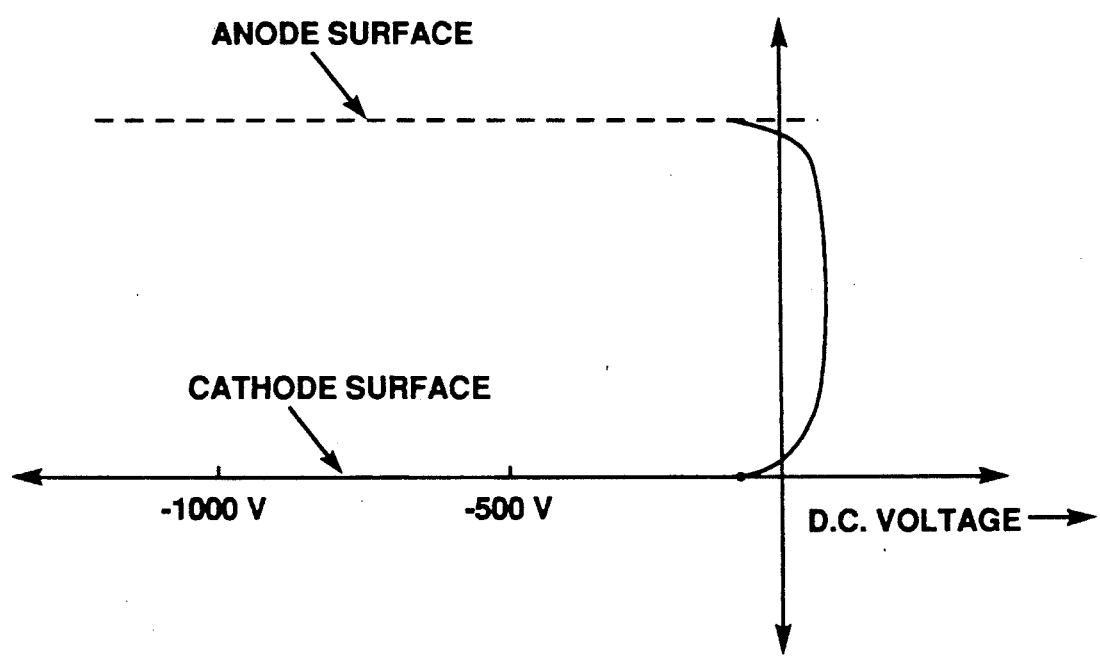
FIG. 2a is a graph illustrating the D.C. voltage levels in the plasma formed between the anode and cathode of the apparatus of FIG. 2.

As seen in FIG. 2a, the negative self-bias on the cathode 42' is much less for the apparatus 10' operating in the plasma etch mode than it was for the apparatus 10 operating in the RIE mode. In consequence, the measurement of the changing D.C. bias must be more sensitive in apparatus 10' to detect a more modest impedance change indicating imminent endpoint. Otherwise, the operation of the apparatus 10' is essentially the same as the operation of the apparatus 10 described previously.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for detecting imminent end-point of a dielectric etching process in a plasma etch system comprising the steps of:
   placing a substrate having a dielectric layer to be etched within a plasma etch chamber proximate a cathode;
   etching said dielectric layer,
   detecting the direct current (D.C.) bias voltage on said cathode; and
   determining imminent end-point of said etching of said dielectric layer by comparing a change in said D.C. bias voltage, caused by a change in the impedance of said substrate as said dielectric layer thins, against a predetermined criteria.

2. A method for detecting imminent end-point as recited in claim 1 wherein said predetermined criteria includes a predetermined voltage level.

3. A method for detecting imminent end-point as recited in claim 1 wherein said step of detecting said D.C bias voltage includes monitoring said D.C. bias voltage over a period of time.

4. A method for detecting imminent end-point as recited in claim 3 wherein said predetermined criteria includes a predetermined voltage level.

5. A method for detecting imminent end-point as recited in claim 3 wherein said predetermined criteria includes a time-related change in said D.C. bias voltage.

6. A method for detecting imminent end-point as recited in claim 5 wherein said time-related change includes a change in slope of said D.C. bias voltage.

7. A method for detecting imminent end-point as recited in claim 6 wherein said change in slope includes a slope less than a predetermined value.

8. A method for detecting imminent end-point as recited in claim 6 wherein said change in slope includes a point of inflection.

9. A method for detecting imminent end-point in a dielectric etching process in a plasma etch system comprising the steps of:
   placing a substrate having a dielectric layer to be etched within a chamber of a plasma etch system between a cathode and anode provided within said chamber;
   applying radio frequency (R.F.) power to at least one of said cathode and said anode and releasing reactant gas into said chamber to initiate the etching of said dielectric layer;
   monitoring the direct current (D.C.) bias voltage of said cathode over time; and
   determining imminent end-point by comparing a change in said D.C. bias voltage, caused by a change in the impedance of said substrate as said dielectric layer thins, against a predetermined criteria.

10. A method for detecting imminent end-point as recited in claim 9 wherein said plasma etch system is operative in a reactive ion etch (RIE) mode where R.F. power is not applied to said anode.

11. A method for detecting imminent end-point as recited in claim 9 wherein said step of monitoring said D.C. bias voltage includes digitizing said D.C. bias voltage and wherein said step of determining imminent end-point includes digitally analyzing said digitized D.C. bias voltage.

12. A method for detecting imminent end-point as recited in claim 11 further comprising the step of removing R.F. power from said cathode when it is determined that end-point is imminent.

13. A dielectric etching apparatus comprising:
   a chamber;
   cathode means for supporting a substrate within said chamber, said substrate having a dielectric layer to be etched;
   anode means separated from said cathode means such that said substrate is between said anode means and said cathode means;
   radio frequency (RF) power means coupled to at least one of said cathode means and said anode means;
   reactant gas release means for releasing dielectric etching gas into said chamber;
   voltage monitoring means coupled to said cathode means and operative to produce a direct current (D.C.) bias signal which varies with the thickness of said dielectric layer; and
   voltage comparison means coupled to said voltage monitoring means for forming a first time derivative of said D.C. bias signal and for producing an imminent end-point signal prior to actual end-point of the dielectric etching process if this time derivative satisfies a predetermined criterion.

14. An apparatus for detecting imminent end-point as recited in claim 13 wherein said voltage monitoring means includes an alternating current (A.C.) blocking network, which substantially attenuates A.C. current but which substantially passes direct current (D.C.), coupled to said cathode and an analog-to-digital (A/D) converter coupled to said A.C. blocking network, wherein said D.C. bias signal is digital.

15. An apparatus for detecting imminent end-point as recited in claim 14 wherein said voltage comparison means includes a digital processor, wherein said digital D.C. bias signal comprises an input to said digital processor.

16. An apparatus for detecting imminent end-point as recited in claim 13 wherein an anode of said plasma etch system is not coupled to an R.F. power source such that said plasma etch system operates in a reactive ion etch (RIE) mode.

17. An apparatus for detecting imminent end-point as recited in claim 13, further comprising means for removing R.F. power in response to said end-point signal.

18. A method for controlling an etching process when plasma etching a dielectric layer comprising the steps of:
   placing a substrate having a dielectric layer to be etched within a plasma etch chamber;
   etching said dielectric layer;
   monitoring a change in impedance of said substrate as said dielectric layer is etched; and
   terminating said etching process prior to the etch-through of said dielectric layer by comparing said change in impedance of said substrate against a predetermined criteria.

19. An apparatus for determining imminent end-point when etching a dielectric layer in a plasma etching system comprising:
   monitoring means for monitoring the change in impedance of a substrate having a dielectric layer as said dielectric layer is being etched; and
   comparison means for comparing said change in impedance against a predetermined criteria to determine imminent end-point.

20. An apparatus for detecting imminent end-point as recited in claim 13, wherein said predetermined criterion is that the magnitude of said first time derivative of said D.C. bias voltage be less than a selected positive number.

* * * * *